United States Patent [19]
Liau et al.

[11] Patent Number: 5,757,830
[45] Date of Patent: May 26, 1998

[54] COMPACT MICRO-OPTICAL EDGE-EMITTING SEMICONDUCTOR LASER ASSEMBLY

[75] Inventors: Zong-Long Liau, Belmont; Dean Z. Tsang, Burlington; James N. Walpole, Concord, all of Mass.

[73] Assignee: Massachusetts Institute of Technology, Cambridge, Mass.

[21] Appl. No.: 597,757

[22] Filed: Feb. 7, 1996

[51] Int. Cl.$^6$ ........................................... H01S 3/02
[52] U.S. Cl. ........................ 372/36; 372/108; 372/109
[58] Field of Search ........................ 372/36, 108, 101, 372/109, 44, 45, 46

[56] References Cited

U.S. PATENT DOCUMENTS

| 4,990,465 | 2/1991 | Liau et al. ............ 437/129 |
| 5,260,822 | 11/1993 | Missaggia et al. ............ 359/337 |

FOREIGN PATENT DOCUMENTS

| 6-196816 | 7/1994 | Japan ............ 372/101 |

OTHER PUBLICATIONS

Olbright, G.R., "Micro-Optic and Microelectronic Integrated Packaging of Vertical Cavity Laser Arrays," SPIE, vol. 1851, pp. 97-105.

Liau, Z.L., "Mass-Transport Fabrication of Large-Numerical-Aperture Microoptics", Reprinted from Micro—Optics/Micromechanics and Laser Scanning and Shaping, Proceedings Reprint, SPIE—The International Society for Optical Engineering, vol. 2383, pp. 310-317, San Jose, California (7-9 Feb. 1995).

Levy, J., "Hybrid Binary Optic Cylinder Lens Array for Collimation of Diode Laser Arrays", SPIE—The International Society for Optical Engineering, Micro–Optics/Micromechanics and Laser Scanning and Shaping, vol. 2383:278-282, San Jose, California (7-9 Feb. 1995).

Beach, R.J., et al., "Applications of Microlens–Conditioned Laser Diode Arrays", SPIE—The International Society for Optical Engineering, Micro–Optics/Micromechanics and Laser Scanning and Shaping, vol. 2383:283-297, San Jose, California (7-9 Feb. 1995).

Connely, S.W., et al., "Diffraction–Limited Virtual Point Source Microlenses", SPIE—The International Society for Optical Engineering, Micro–Optics/Micromechanics and Laser Scanning and Shaping, vol. 2383:252-260, San Jose, California (7-9 Feb. 1995).

*Primary Examiner*—James W. Davie
*Attorney, Agent, or Firm*—Hamilton, Brook, Smith & Reynolds, P.C.

[57] ABSTRACT

In an apparatus and method for aligning a microlens relative to an edge-emitting semiconductor laser, the components are aligned and coupled without the need for intermediate optics. An edge-emitting semiconductor laser is mounted to a support body which preferably operates as a heat sink. The support body has a side face, which is substantially parallel by the emitting face of the laser. The microlens is formed on a lens substrate. The lens substrate is mounted adjacent the emitting face of the laser and further mounted adjacent the side face of the support body such that the optical axis of the lens substantially aligns with the optical axis of the laser. A substantial portion of the lens substrate extends along the plane of the side face of the support body. The invention has applications in coupling high-power laser energy into fiber optics and in optical computing devices requiring arrays of lasers.

22 Claims, 6 Drawing Sheets

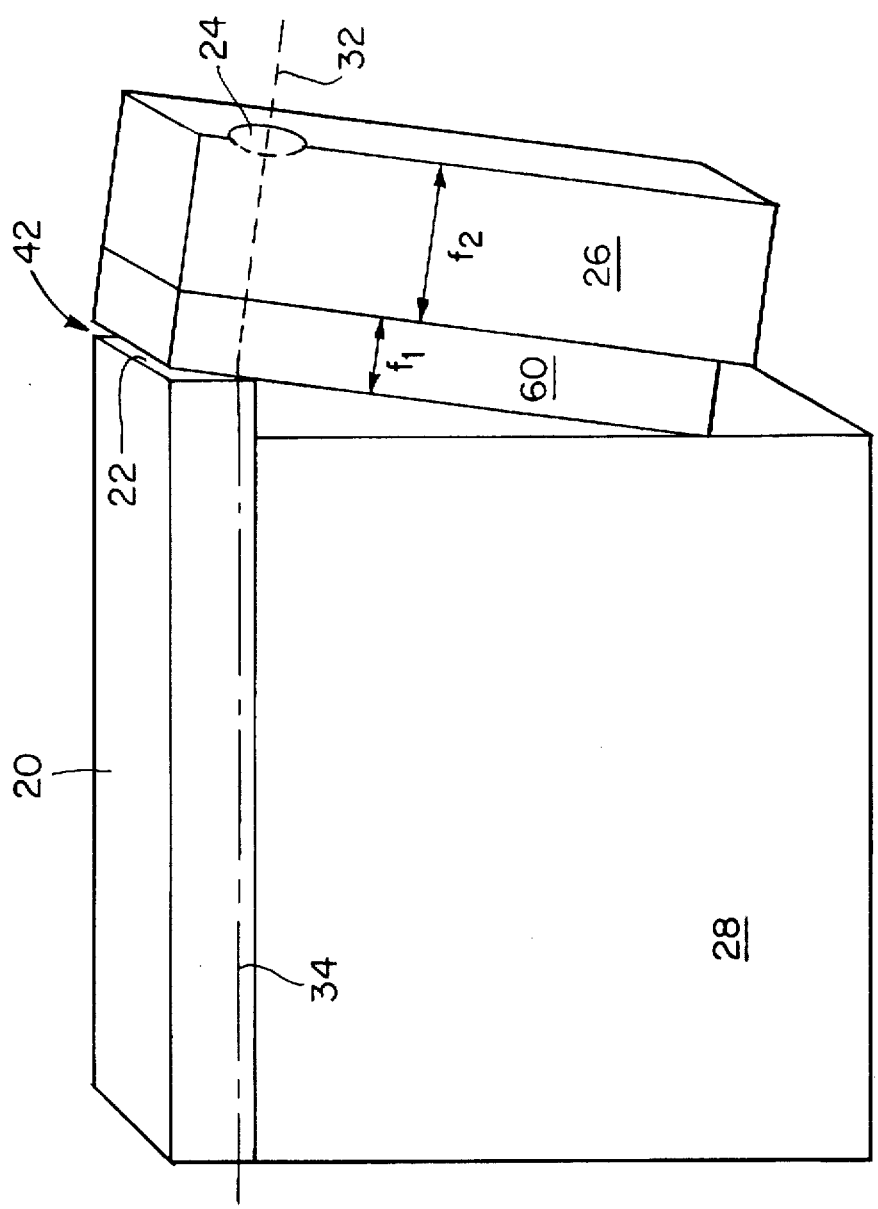
FIG. 5
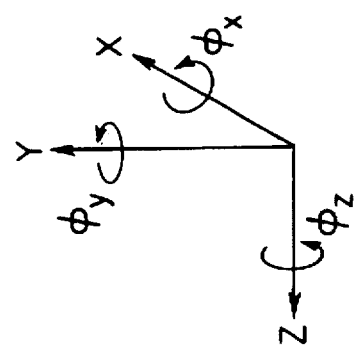

COMPACT MICRO-OPTICAL EDGE-EMITTING SEMICONDUCTOR LASER ASSEMBLY

GOVERNMENT SUPPORT

The Government has rights in this invention pursuant to Contract Number F 19628-95-C-0002 awarded by the United States Air Force.

BACKGROUND OF THE INVENTION

Light energy emitted from an edge-emitting semiconductor laser is generally divergent in nature. Unless the laser energy is collimated or otherwise focused, only a small central portion of the transmitted divergent beam reaches the intended receiver. The remainder of the beam is wasted. For example, where a semiconductor laser beam is directed to a fiber optic, any light which diverges beyond the face of the fiber optic is wasted. To overcome this problem, optics, for example microlenses, are often used to collimate or otherwise focus the beam before it enters the fiber optic. In this manner, a large percentage of the emitted beam propagates through the fiber optic to its output end, reducing wasted energy and thereby increasing system efficiency.

Alignment of a microlens with an edge-emitting semiconductor laser is typically a challenging task as it requires micrometer accuracy in six degrees of freedom, that is, both axially along and rotationally about three orthogonal axes. Such accuracy can be achieved in the laboratory by mounting the laser and the microlens on a vibration isolator table and fine-tuning their placement with a micromanipulator. Another method employs external packaging devices comprising pre-formed structures for receiving the components in predefined locations, adding an additional level of complexity, imprecision, and expense. Substantial air gaps between the laser and lens introduced by these approaches result in divergence of the emitted light before it is optically-altered (collimated or focused). This makes alignment along the axis of propagation critical, which heightens the need for precision mounting of the lens once it is aligned. These techniques are not suitable for practical applications of semiconductor lasers which require compact assemblies amenable to manufacturing.

U.S. Pat. No. 4,990,465, the teachings of which are incorporated herein by reference, discloses forming a surface-emitting laser diode array with edge-emitting semiconductor lasers. An array of heterostructure diode lasers formed on a substrate emit laser energy along a plane parallel to the substrate. Parabolic mirrors redirect the beams along an axis normal to the substrate. An array of microlenses fabricated on the top of the structure collimate the reflected beams. In this manner, the device permits focusing of an edge-emitting semiconductor laser with a microlens through the use of intermediate optics, namely a mirror.

An advantage of this method is that the microlens is formed of the same material as the laser and therefore, exhibits a substantially similar index of refraction. This reduces the divergence of the beam between the laser and lens. While this method simplifies certain alignment problems, it also serves to complicate fabrication complexity. In particular, the fabrication of the parabolic reflectors for redirecting the light is a complicated process which may render the device cost prohibitive for practical applications.

SUMMARY OF THE INVENTION

The present invention is directed to an apparatus and method for aligning and joining a microlens with an edge-emitting semiconductor laser without the need for intermediate optics. More particularly, the present invention is directed to a simplified packaging technique for placing the microlens in precise physical contact with the emitting surface of the edge-emitting semiconductor laser. This technique results in a compact hybrid design which is easier to manufacture and offers improved accuracy over prior art techniques. It also benefits from the ease of fabrication of a microlens in III–IV semiconductor material and from the relative ease of fabrication of an edge-emitting semiconductor laser.

The apparatus of the invention includes an edge-emitting semiconductor laser mounted to a support body, for example, a heat sink. The optical axis of the laser projects through its emitting face. The support body has a side face, the plane of which is substantially parallel to the plane defined by the emitting face of the laser. A microlens is formed on a lens substrate. The optical axis of the microlens projects transversely through the substrate. The lens substrate is mounted substantially parallel to the emitting face of the laser and is further mounted substantially parallel to the side face of the support body so that the optical axis of the lens substantially aligns with the optical axis of the laser. A substantial portion of the lens substrate extends along the plane of the side face of the support body. For purposes of the present invention, the term "substantially parallel", when used to define the relationship between the lens substrate and the side surface of the heat sink, is defined as parallel to within a level of precision which allows for slight angular misalignment therebetween. This will be discussed in further detail below.

The points of contact between the microlens substrate, the laser, and the heat sink provide known reference points for aligning the lens relative to the laser. The reference points are in direct relation to the laser output surface. This is an improvement over the use of the secondary reference points on an integrated circuit chip, as proposed by Olbright, et al., "Micro-Optic and Microelectronic Integrated Packaging of Vertical Cavity Laser Arrays," SPIE, Vol. 1851/97, in aligning an array of microlenses on the emitting surface of an array of vertical cavity surface emitting lasers (VCSEL).

In a preferred embodiment, the index of refraction of the lens substrate is substantially equal to the effective index of refraction of the edge-emitting semiconductor laser. This results in reduced divergence of the beam between the laser and the lens in comparison to prior art techniques wherein it is common to have a large air gap therebetween. The semiconductor laser is preferably mounted to the support body such that the emitting face of the laser projects beyond the plane defined by the side face of the support body. This projection improves and simplifies the alignment process. The support body preferably comprises a heat sink for removing heat from the laser. A spacer may be positioned between the lens substrate and the laser to provide additional distance or adjustability therebetween.

A raised region can be formed on the side surface of the support body or the lens substrate. This allows for compensation of rotational misalignment between the laser and support body. The laser, lens substrate, and heat sink are preferably formed of materials which exhibit similar thermal expansion rates such that the system is operable over a range of temperatures.

BRIEF DESCRIPTION OF THE DRAWINGS

The above and other features of the invention including various novel details of construction and combinations of parts, and other advantages, will now be more particularly described with reference to the accompanying drawings and pointed out in the claims. It will be understood that the particular method and device embodying the invention is shown by way of illustration and not as a limitation of the invention. The principles and features of this invention may be employed in various and numerous embodiments without departing from the scope of the invention.

FIG. 5 is a perspective view illustrating coupling between the lens substrate and the semiconductor laser using a spacer to facilitate positional alignment of the lens along the z-axis.

DETAILED DESCRIPTION OF PREFERRED EMBODIMENTS

Figure 1:
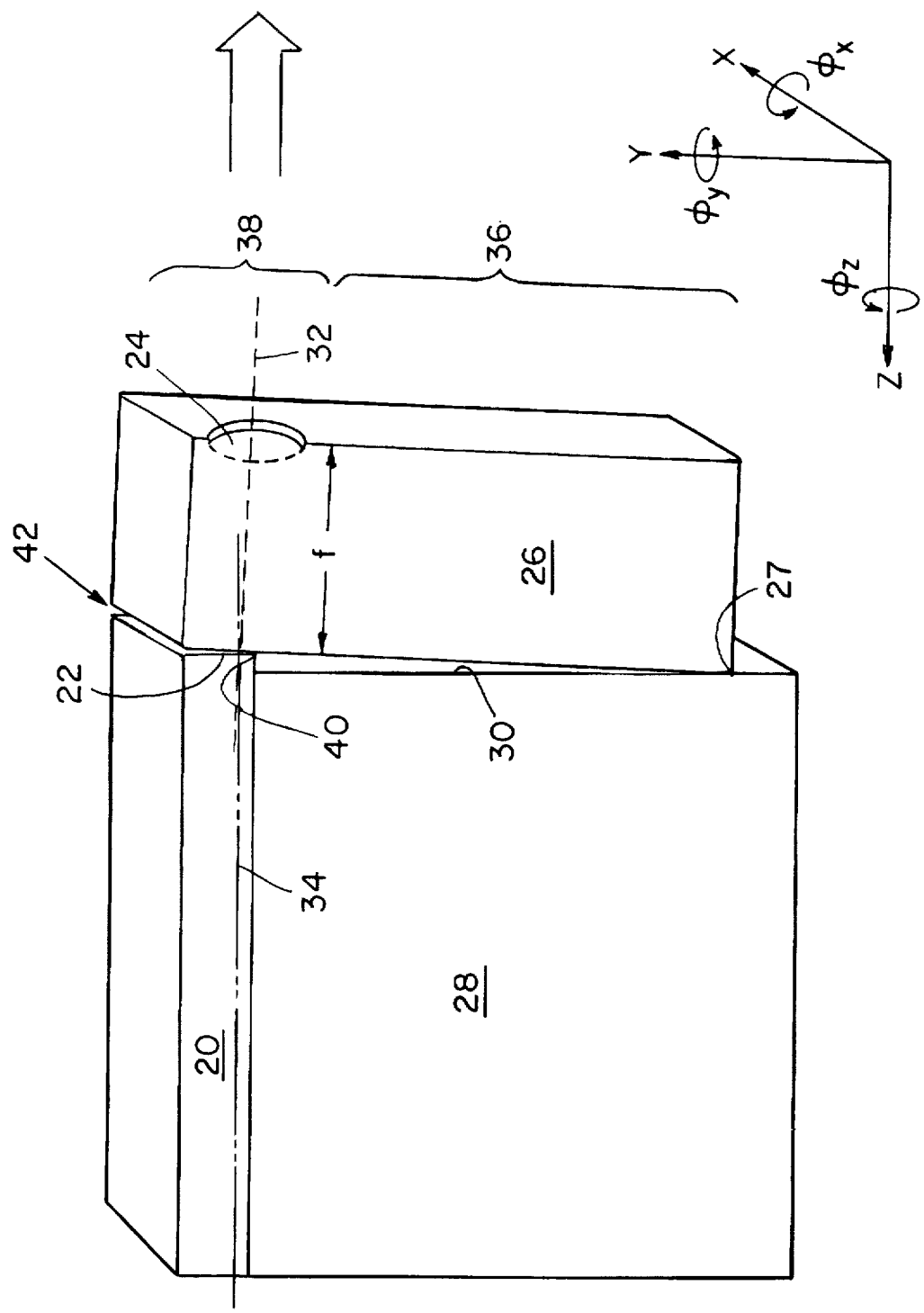
FIG. 1 is a perspective view of a preferred embodiment of the invention wherein the emitting face of the semiconductor laser projects slightly beyond a side face of the support body and wherein the lens substrate comes in contact with an edge of the emitting face of the laser and with the side of the support body.

FIG. 1 is a cutaway perspective view of a preferred embodiment of the invention illustrating alignment of a microlens 24 with an edge-emitting semiconductor laser 20. An edge-emitting semiconductor laser 20 is coupled to or mounted on a support body 28, preferably operating as a heat sink 28 for the laser 20. They are coupled such that the emitting face 22 of the laser 20 is either flush with or projects slightly beyond a side surface 30 of the heat sink 28. The side face 30 of the heat sink 28 is preferably substantially parallel to the plane of the emitting face 22 of the laser. However, in practice, rotational misalignment of the laser 20 relative to the heat sink 28 about the y-axis $\phi_y$ may occur.

A microlens 24 is preferably integrally fabricated on a lens substrate 26. The lens substrate 26 is attached to the laser 20 such that the optical axis of the microlens 32 substantially aligns with the optical axis of the laser 34. A substantial portion 36 of the lens substrate 26 extends laterally from the lens area 38. The extension 36 serves several purposes. First, it operates as a handle which provides a sizeable surface, (length approximately 2,000 microns, for example) well-suited for manipulating the microlens 24 relative to the laser 20. This alleviates the challenge of aligning a microscopic lens (diameter approximately 100 microns) with a microscopic laser (depth approximately 80 microns). Second, the relatively large extension also provides added stability to the structure after mounting. The extension 36 further serves to simplify positional alignment of the lens 24 relative to the laser 20 along the z-axis, as will be discussed below.

In a preferred embodiment, the emitting face of the laser 22 extends slightly beyond the side face 30 of the support body 28. Although at first glance, this projection seems undesirable, such an arrangement actually improves and simplifies the alignment process.

A key alignment parameter is the distance along the z-axis between the lens 24 and the emitting face of the laser 22. For proper focus, that distance must be within a specific tolerable distance, for example 2 microns, of a specified distance. However, the apparatus used to position the laser 20 on the heat sink 28 can only do so within a certain precision, for example 12 microns. Accordingly, if one were to attempt to position the laser 20 with its emitting face 22 flush with the side face 30 of the heat sink, there is a likelihood that the emitting face 22 would be set back from the side face 30 of the heat sink 28 a distance greater than the tolerance, e.g., 2 microns.

By intentionally projecting the emitting face 22 beyond the side face 30 of the heat sink, accurate distance tolerance along the z-axis is maintained despite positional intolerances generated by the resulting angular air gap 42. Specifically, the lens substrate 26 comes into direct contact with the lower edge 40 of the laser to assure proper spacing along the z-axis between the lens 24 and that edge 22. Also, the height of the lens substrate 26 is substantial relative to the length of the projection of the emitting face 22 of the laser; for example, the ratio is about 2,000 microns to 10 microns. Accordingly, the tilt angle θ (see FIG. 2) is slight. The tilt angle θ is a rotational misalignment $\phi_x$ of the lens 32 about the x-axis. That slight tilt angle θ results in a very slight positional misalignment along the z-axis. This misalignment is tolerable even at the widest point of the resulting air gap 42. For example, if the emitting face 22 of the laser was specified to be positioned 10 microns from the side face 30 of the heat sink, but instead extended 22 microns due to the tolerances of the placement apparatus, the maximum misalignment resulting from the angular air gap 42 would be less than 1 micron. On the other hand, if with the 12 micron tolerance, the laser face 22 were set back 2 microns from the side face 30 of the heat sink, the misalignment would be an acceptable 2 microns. It should be noted that for the purpose of illustration, the views of FIGS. 1 and 2 exaggerate the size of the angle of the air gap θ.

Figure 2:
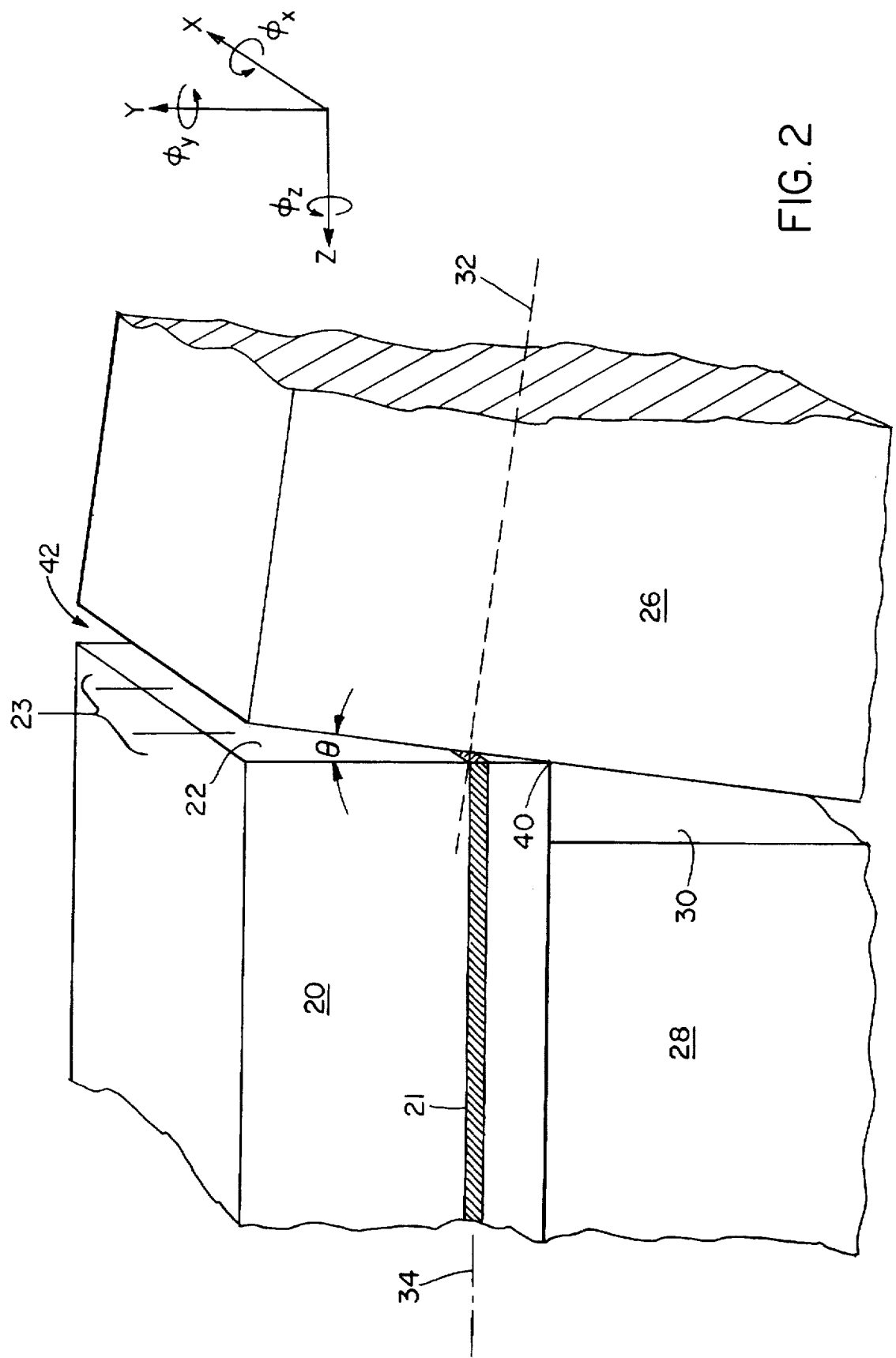
FIG. 2 is a close-up perspective view of the air-gap region of FIG. 1.

An expanded view of the air gap is shown in FIG. 2. In this expanded view, the axis 34 of the active region 21 of the laser is shown in alignment with the optical axis of the lens 32. It should be noted that only a small central portion 23 of the active region 21 emits laser light. Although the "tilted" structure shown results in the lens surface being disposed at an angle θ to the emitting surface of the laser, that angle θ is sufficiently small (less than 1 degree) such that any air gap 42 introduced by the deflection of the lens substrate about the x-axis $\phi_x$ is within tolerable limits (less than 1 micron). The air gap is sufficiently small such that divergence of the light in the gap region 42 is insignificant. For example, in a preferred embodiment, the depth of the semiconductor laser is 80 microns, the length of the portion of the laser extending beyond the side surface of the heat sink is approximately 10 microns, and the length of the substrate is approximately 2,000 microns. This introduces an angular air gap between the semiconductor laser and the lens substrate of approximately 0.29 degrees, introducing a maximum distance at the top of the gap 42 between the laser 20 and lens substrate 26 of approximately 0.4 microns, well within tolerable limits.

If an attempt were made to mount the lens substrate flush with the projecting emitting face of the laser, the lens substrate might not come in contact with the heat sink as the emitting face of the laser and the lens substrate would be parallel. To alleviate this problem, the lens substrate 26 is tilted slightly, as described above, so that it contacts the heat sink at a continuous line of points along the substrate edge and also contacts the laser at a line of points along the corner 40 of the emitting face. This "tilted" structure, as in the "flat" structure described above, offers the advantages of stability, and packageless design. As an added advantage, the "tilted" structure offers a "self-alignment" feature as it provides a reference point for longitudinally aligning the lens relative to the laser. If the depth of the lens substrate f is known, then the "tilted" structure assures that the lens is exactly that known distance from the emitting surface 22 of the laser.

This approach eliminates at least three degrees of freedom for alignment of the lens 24 relative to the laser 20. Positioning along the z-axis is determined by the depth f of the microlens substrate, which can be polished accurately to within 1.0 micron. Rotation about the x-axis $\phi_x$ is fixed when the microlens substrate is bonded with the heat sink and the laser output surface. The same applies to rotation about the y-axis $\phi_y$. The remaining degrees of freedom, namely position along the x-axis and y-axis, and rotation about the z-axis can be compensated for in the final assembly by fabricating guide walls or bumps on the side surface of the heat sink as will be shown below. In this manner, the invention guarantees parallelism between the laser 20 and lens 24 to within a precision level defined by a small tolerable error introduced by the angular air gap 42.

In an alternative embodiment of the present invention, the output face 22 of the laser is aligned flush with the side face 30 of the heat sink 28. In this case, the tilt angle θ is nearly zero as the back side of the substrate 26 and the side face 30 of the heat sink 28 are nearly parallel. This "flat" embodiment offers similar advantages to those of the "titled" embodiment, if it can be assured that the emitting face 22 of the laser is indeed flush with the side surface 30 of the heat sink, and not set back. If the laser is set back, then the lens substrate will fail to make contact with the emitting face 22 of the laser, and therefore, positional alignment along the z-axis is not guaranteed.

Figure 3:
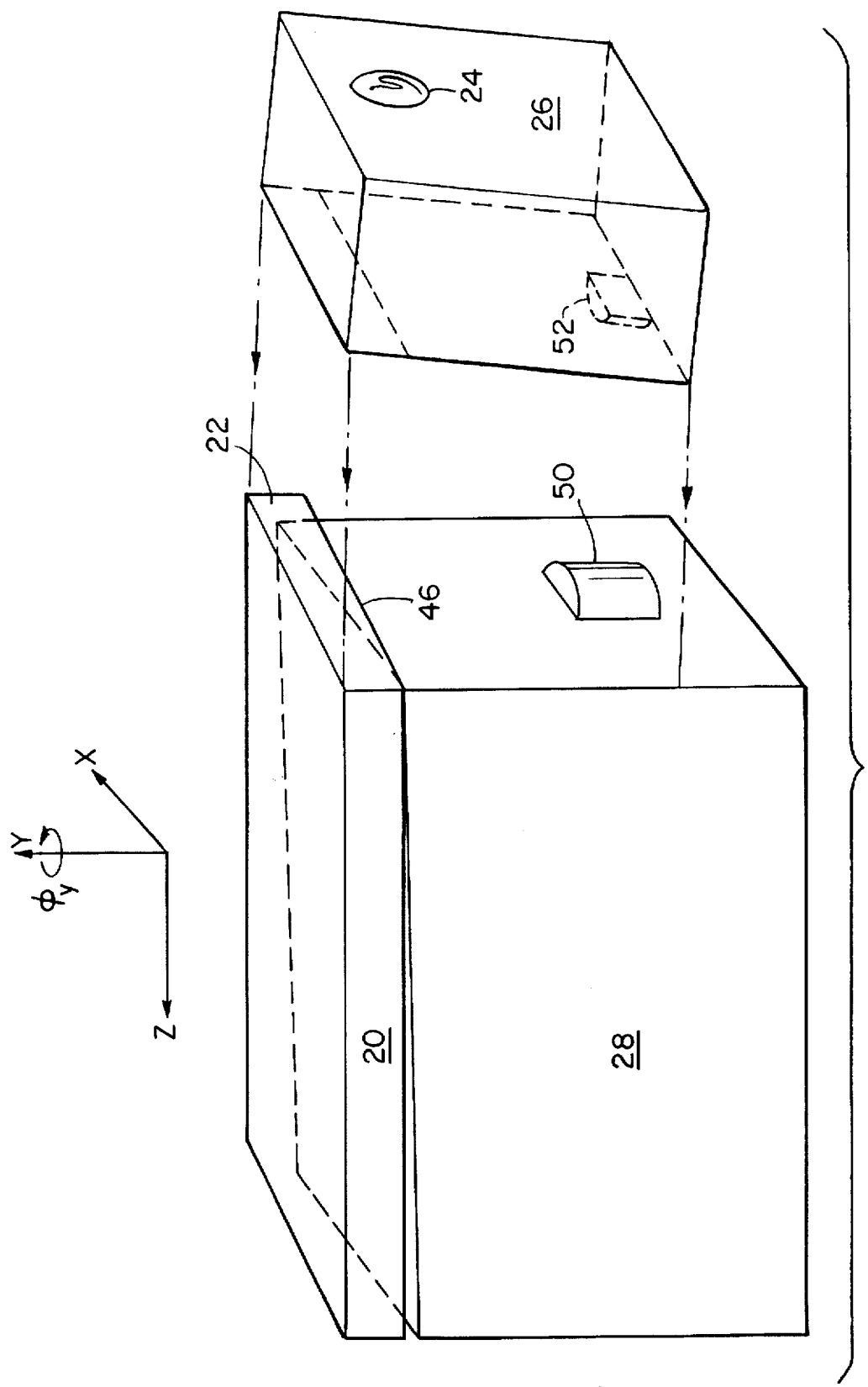
FIG. 3 is a perspective view of an embodiment illustrating rotational misalignment about the y-axis between the laser and heat sink and further illustrating raised regions formed on the heat sink and lens substrate for compensating for the misalignment.

The present invention is also amenable for compensating for rotational misalignment (about the y-axis), between the laser 20 and heat sink 28. This is illustrated in FIG. 3.

In practice it is difficult to align the laser 20 and heat sink 28 such that the emitting face of the laser 22 is parallel to the side face of the heat sink 30. With rotational misalignment, if the lens substrate 26 is brought into contact with the heat sink, the substrate will make contact with either corner of the emitting face of the laser 22 at a single discrete point, rather than contacting the entire edge 46 of the emitting face 22. This results in misalignment of the lens relative to the laser. To compensate for this undesirable effect, a raised regions 50,52 can be fabricated on the side of the heat sink or on the lens substrate 26 for the substrate to rest on and rotate about. Therefore, the substrate can be brought into contact with the entire edge 46 of the output face 22 of the laser and simultaneously contact the side surface of the heat sink at the raised region 50. This results in simplified alignment of the lens as the structure eliminates three of the six degrees of freedom in the lens: position along z-axis; tilt about x-axis; tilt about y-axis. Alignment of the lens and laser along other degrees of freedom can be assured by fabricating precision alignment walls on the support body or lens substrate. This provides a stable, self-packaged structure as described above.

Figure 4:
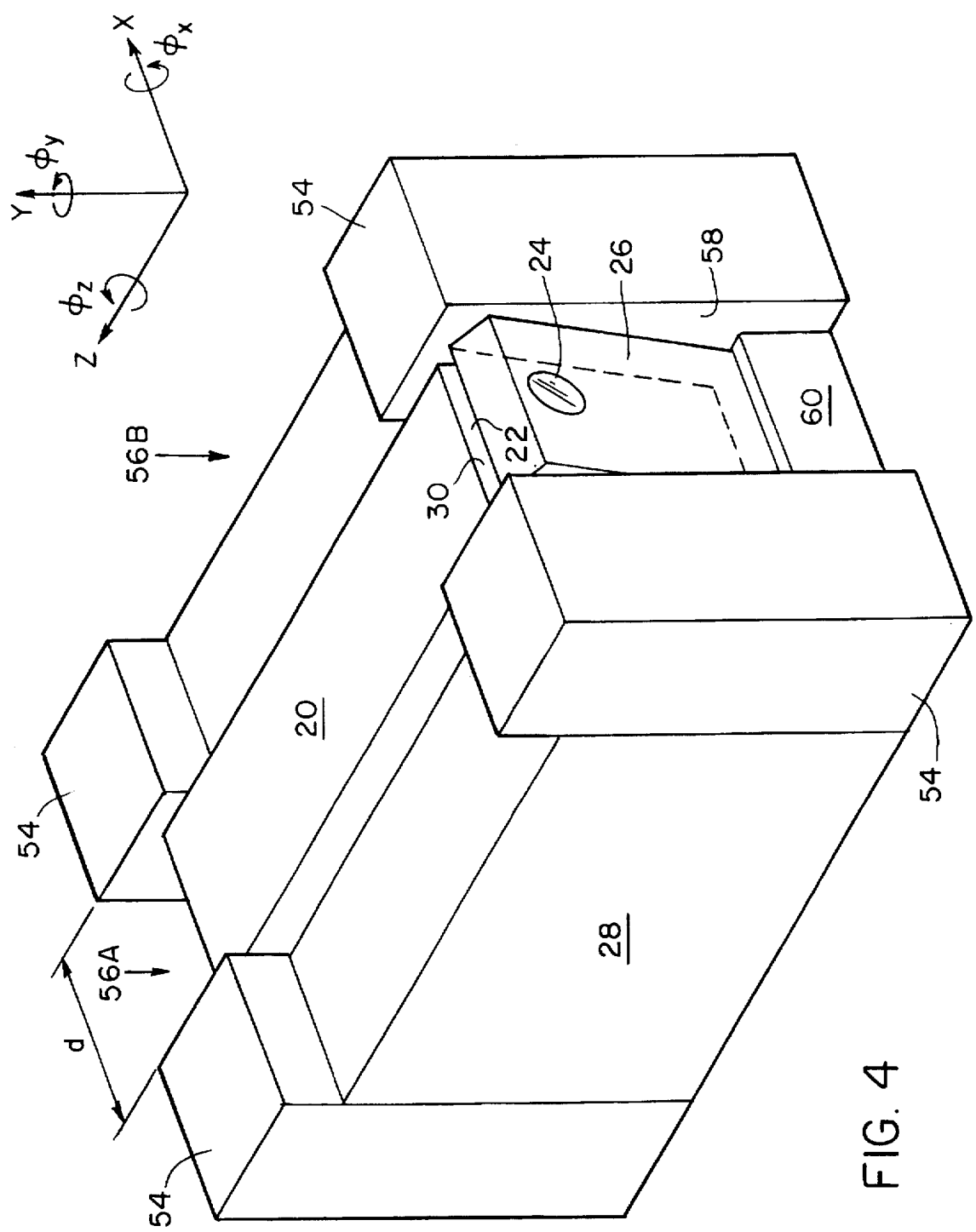
FIG. 4 is a perspective view of an alternative embodiment of the invention illustrating guide members providing alignment between the laser and lens and preventing movement of the lens in all six degrees of freedom.

FIG. 4 is a perspective view illustrating a preferred method for mounting and aligning the laser 20 and lens 24. A plurality of monolithic columns 54 are bonded to the heat sink 28. Channels 56A,56B are created between a side surface 30 of the heat sink, and two side surfaces 58 of the columns 54. The columns 54 are set apart a distance d to accommodate a laser 20 of width slightly less than d. The laser 20 is set to the heat sink 28 and aligned between the channels 56A, 5GB. The emitting face of the laser 22 is positioned to extend slightly beyond the side face 30 of the heat sink as shown in FIG. 1 to facilitate accurate alignment of the lens 24 with respect to the z-axis. The lens substrate 26 is cleaved to the same width as the laser 20, that width being slightly less than the width d of the channels 56A, 56B. The lens 24 is set in the channel 56B adjacent the laser 20 and heat sink 28. The laser is pushed against an inner wall 58 of one of the columns 54 and bonded. Once set, the substrate 26 is bonded to the emitting face of the laser 22 and to the side wall of the heat sink 30 as shown in FIG. 1. To facilitate alignment along the y-axis, an additional monolithic guide 60 can be added to the structure. If the guide member 60 is aligned correctly, the lens substrate 26 can be set directly thereon, eliminating all six degrees of freedom in the lens: position along the x-axis, y-axis, and z-axis, and tilt about the x-axis, y-axis, and z-axis.

It should be noted that in some applications of the present invention, it may be difficult to predict the dimensions of the components to within precise tolerances, such that they will all fit together accurately in the final structure. For this reason, one may want to keep at least one degree of freedom released to allow for compensation of these inaccuracies. For example, in FIG. 4, the bottom structure 60 may be removed to allow for final placement of the lens along the y-axis, while fixing the other five degrees of freedom.

The invention is applicable to collimating light emitted from tapered semiconductor lasers as disclosed in U.S. Pat. No. 5,260,822, the teachings of which are incorporated herein by reference. These tapered gain regions allow high power output to be generated in a laser. The taper angle is normally limited to less than 6° by Snell's law. Preliminary calculations demonstrate that if the present invention is used with a tapered semiconductor laser, divergence is reduced due to the small air gap between the laser and the microlens, and therefore, the maximum theoretical taper angle in the laser can be at least doubled to approximately 12° or beyond. The widened taper angle results in a theoretical doubling of output power.

The present invention offers the advantage of a packageless design which is amenable to self-alignment and is tolerant of misalignment. The packageless design arises from its self-supporting nature. The triangular structure formed between the bottom surface of the microlens substrate, the side surface of the heat sink, and the extended portion of the laser provides a rigid frame which is fixed when the components are bonded together. The components are preferably formed of materials which exhibit similar thermal expansion characteristics, so that the laser system is operable over a range of temperatures. Furthermore, if the components are semiconductor-based, metal paths can be etched thereon to assist in alignment and soldering.

A number of techniques are known for fabricating the microlens. Semiconductor materials are preferred over glass or plastic because the index of refraction is similar to the effective index of refraction of the laser and because the thermal expansion coefficient would match that of the semiconductor laser material. The lenses are preferably fabricated on a III–V wafer, such as a gallium phosphide wafer, by semiconductor photolithography. An array of lenses are formed on the wafer and the wafer is sliced into individual lenslets or arrays of lenslets of a predetermined size. The lenslets may be etched by any of the known processes including but not limited to reactive ion etching, chemical etching, ion milling, and reactive ion beam assisted etching and, as necessary, formed into final shape by the mass transport process described in U.S. Pat. No. 4,784,722. The lenses may further be formed as glass or plastic molded lenses, holographic lenses, or diffractive optical elements.

The components of the laser system may be bonded by various known bonding methods. For example, the laser may be soldered to the heat sink by well-known soldering methods. Alternatively, the lens may be coupled to the laser and heat sink with readily-available ultraviolet-cured adhesive. The adhesive is layered on the region of contact before the components are set in place. When set, the region of contact is exposed to ultraviolet light which cures the adhesive. As an alternative, metal runs may be formed on the components in the bonding regions. After the components are set, they can be welded together using laser welding techniques. A high power laser is focused on the point of contact which creates a puddle of metal which couples the components after the metal cools.

For forming the column structures 54,60 shown in FIG. 4, regions on the heat sink may be etched to predetermined depths. The columns may also be cut or cleaved in semiconductor material and bonded to the heat sink 26. To form the raised surfaces 50,52 shown in FIG. 3, the heat sink 28 or lens material 26 may be etched around the raised surfaces, leaving the raised portions 50,52 behind. As an alternative, the raised portions can be formed of semiconductor or other material and bonded to the surfaces as shown.

The heat sink is preferably formed of a material which exhibits thermal expansion rates similar to the semiconductor materials of the laser and lens. A preferred material is a pressed Tungsten-Copper mixture, the average thermal expansion of which can be varied as a function of the proportion of Copper in the material. Ceramic materials and silicon materials of various thermal expansion rates may also be used.

While the preferred embodiment of the invention employs atomically-cleaved components to guarantee that the coupled surfaces are flat, if the lens substrate, heat sink, or laser output surface are not filed perfectly flat, the lens may still be aligned relative to the laser along the z-axis because, for the "tilted" embodiment, the pivot point at the corner 40 of the laser output surface defines the alignment. The pivot point 40 is the only location where the microlens substrate 26 contacts the laser 20. The resting point 27 of the microlens substrate 26 on the heat sink 28 can be varied to compensate for variability in flatness of the device. This applies equally well to an individual lens/microlens combination as it does to a one-dimensional array of lenses/microlasers.

Longitudinal positioning of the lens relative to the output surface of the laser is simplified because the lens is formed on a semiconductor substrate of known depth. To collimate the output beam, the depth of the lens substrate is set equal to the focal length of the lens. Convergent and divergent focusing effects are attainable by setting the depth greater than or less than the focal length of the lens respectively.

FIG. 5 illustrates an alternative embodiment of the invention for positional alignment of the lens 24 along the z-axis. If the substrate thickness f is insufficient for producing the desired distance between the lens 24 and the output face 22 of the laser, then a spacer 60 or stand-off may be bonded to the backside surface of the substrate 26 as shown to provide additional distance $f_1$. For example, if the focal length of the lens 24 is $f_3$ and the substrate thickness $f_2$ is less than $f_3$, then an additional spacer 60 of thickness $f_1$ may be added, where $f_1+f_2=f_3$, to produce the desired distance $f_3$ for collimating the beam. This alternative embodiment allows for double-sided lenses with curved surfaces on both sides of the lens substrate, for reduced aberrations.

Another advantage of the present invention is that it is more tolerant to misalignment than prior art packaging techniques. Snell's law states that the divergence of light propagating through a medium increases as the index of refraction of the medium decreases. Therefore, if a large air gap (index of refraction of air=1) is introduced between the laser output surface and the lens, initial alignment during manufacturing is far more critical. This makes the system more sensitive to misalignment, which can introduce aberrations in the focused beam. The present invention avoids this problem because for a substantial portion of the distance between the output surface of the laser 20 and the lens 24, the light propagates through the lens substrate 26. If semiconductor microlenses are employed, for example semiconductor microlenses fabricated in the "mass-transport" process, the index of refraction is comparable to that of the semiconductor laser (index of refraction of semiconductor= 3.3). This results in a smaller light divergence which makes positioning of the lens relative to the output surface of the laser more tolerant to misalignment. This feature further improves laser energy collection efficiency, as more light is centered through the lens, instead of diverging out the sides of the air gap.

Mass-transported Gallium Phosphide (GaP) microlenses are attractive for application to this invention because they can be fabricated with high numerical aperture (NA) for good light-collection efficiency and because the high refractive index of GaP allows much looser tolerances for errors in the microlens fabrication or in the optical alignment. The mass-transport process is described in U.S. Pat. No. 4,784, 722 the teachings of which are incorporated herein by reference. A multiple-mesa preform is first etched in a GaP substrate by using precision photolithography followed by ion-beam-assisted $Cl_2$ etching. (See copending U.S. Ser. No. 08/313,550, Liau, et al., filed Sep. 27, 1994, the contents of which are incorporated herein by reference). The lens profile is accurately encoded in the mesa-width variations in the preform. The wafer is then heat-treated at 1100° C. for 20 hours in a protective environment, during which vapor transport occurs for the minimization of the surface energy, and the preform smooths to become the desired microlens. One main advantage of this technique is its capability for accurate formation of almost any desired lens profile. Recent work with anamorphic microlenses resulted in two distinct curvatures for correcting the astigmatic output of high-power lasers with a laterally tapered gain region. With one single anamorphic microlens, the tapered-laser's astigmatic output was corrected, made nearly round, and efficiently coupled into a single-mode fiber. This is much simpler and more compact compared to the cumbersome bulk lens system.

More recently, spherical microlenses were fabricated in two-dimensional arrays with a nominal diameter of 140 µm on a pitch of 300 µm. The lens wafer was carefully polished to a thickness of 423 µm, because these 0.46-NA lenses have a depth of focus of approximately ±4 µm in GaP. The lens array chip was 2 mm long in the vertical direction to minimize tilt misalignment $\phi_x$ along the x-axis. The lenses were coated for low reflection with a quarter-wavelength thickness of $SiO_2$.

Figure 6:
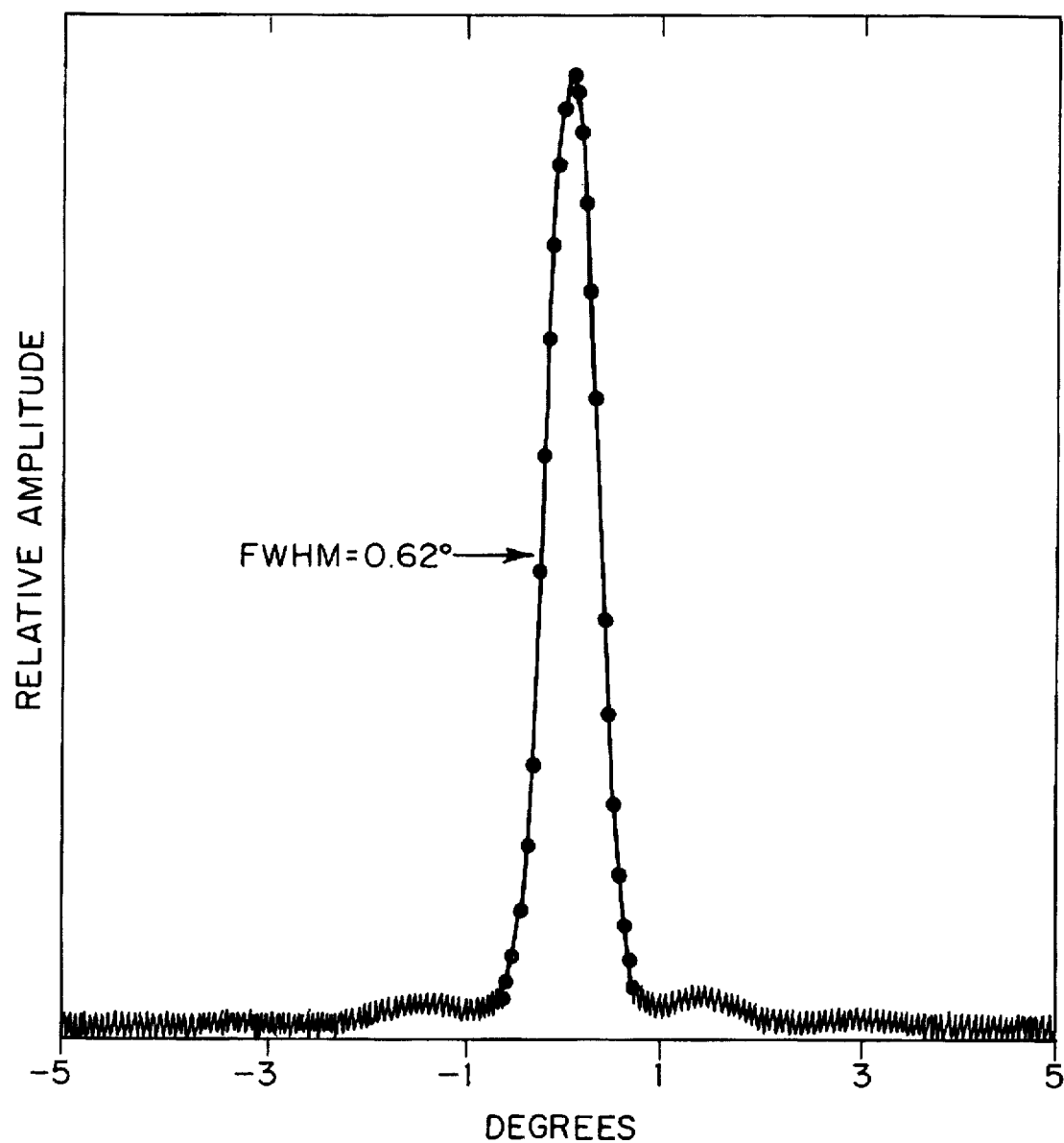
FIG. 6 is a chart of relative amplitude as a function of angle from beam center representing far-field measurement of an experimental optical assembly perpendicular to the laser junction in accordance with the present invention.

An initial demonstration employed an edge-emitting 980-nm ridge-waveguide laser array with a pitch of 150 µm. The array was soldered to a heat sink using conventional die attachment techniques with attention to ensure that the solder did not flow beyond the laser output facet and interfere with subsequent lens attachment. In this case, each edge of the laser array protruded 10 microns above the heat sink and the 68-µm thick laser chip was mounted stripe up. The lens array was actively aligned to the laser array with micropositioners. The lateral and transverse positions and the rotation of the lens array were adjusted such that each lens was centered on a laser emitter. No adjustment of the lens position along the z-axis in the direction of laser emission or of the tip $\phi_x$ and tilt angle $\phi_y$ of the lens was necessary because those degrees of freedom are set by the fabrication of the lens and the mounting arrangement. The lens was then attached directly to the laser heat sink with ultraviolet-curable adhesive. The heat sink was Au-coated silicon with a lapped and polished flat edge used for the lens attachment surface. The tilt angle of the lens relative to the heat sink from the laser protrusion and the length of the lens array chip was estimated to be about 0.3°. Far-field scans taken in the directions parallel and perpendicular to the laser junction demonstrated a full width at half-maximum of about 0.8° and 0.6° as shown in FIG. 6, much narrower than the far-field pattern of the laser without the lens. The far-field pattern is narrow perpendicular to the junction because the lens is more completely filled by the wider divergence of the laser in that direction.

Estimates of the effects of misalignment based on optical path length differences for this approach are encouraging. Lens aberrations and misalignments can produce optical path length differences that result in phase front distortions that are large enough to reduce coupling efficiencies to single-mode fiber. While biconvex lenses can be corrected for spherical aberration with the lens centered on the laser, significant phase front distortions can still result if the lens is laterally misaligned even slightly, e.g., 1 µm off axis. By using this approach with planoconvex lenses, the high refractive index of the GaP allows light rays to remain paraxial even at large numerical apertures, and the phase front distortion in the outer regions of the lens is estimated to be no more than $\lambda/10$ over lateral misalignments of $\pm 10$ µm. Negligible phase front distortions are important for applications such as efficient coupling to single-mode fiber. The microlens packaging approach, which is very compact and does not require rigid external lens mounts, can reduce the number of independent axes required to align laser arrays and lens arrays in future free-space and fiber-coupled optical systems.

The present invention has application in fields involving coupling of high-power laser energy into a fiber optic: medical laser probes, optical explosive detonators, high-power data communication devices, pumping Erbium-doped fiber amplifiers; and involving optical computing devices which require arrays of lasers: optical signal processing systems, image recognition.

While this invention has been particularly shown and described with references to preferred embodiments thereof, it will be understood by those skilled in the art that various changes in form and detail may be made therein without departing from the spirit and scope of the invention as defined by the appended claims.

We claim:

1. A laser system comprising:
an edge-emitting semiconductor laser mounted to a support body, the laser having an optical axis which projects through an emitting face of the laser and the support body having a side face substantially parallel to the plane of the emitting face of the laser; and
a lens substrate having a lens formed thereon, the lens having an optical axis which projects transversely through the substrate, the lens substrate being mounted adjacent the emitting face of the laser and mounted adjacent the side face of the support body such that the optical axis of the lens substantially aligns with the optical axis of the laser and such that a substantial portion of the lens substrate extends along substantially parallel to the plane of the side face of the support body, and wherein the semiconductor laser is mounted to the support body such that the emitting face of the laser projects beyond the side face of the support body.

2. The laser system of claim 1 wherein a raised region is formed on one of the side surface of the support body and the lens substrate and wherein the lens substrate contacts the support body at the raised surface.

3. The laser system of claim 1 wherein the support body comprises a heat sink for removing heat from the laser.

4. A laser system of claim 1 wherein the lens substrate is formed of a material having an index of refraction which is substantially similar to the effective index of refraction of the semiconductor laser.

5. The laser system of claim 1 further comprising a spacer disposed between the laser and the lens substrate for providing proper lens to laser separation for optically altering a beam of light emitted by the laser.

6. The laser system of claim 1 wherein the substrate has a thickness substantially equal to the focal length of the lens such that the lens operates to collimate a beam of light emitted by the laser.

7. The laser system of claim 1 wherein the substrate has a thickness less than or greater than the focal length of the lens such that the lens operates to focus a beam of light emitted by the laser.

8. The laser system of claim 1 wherein the lens substrate comprises a material of index of refraction greater than 1.

9. The laser system of claim 1 wherein the lens substrate comprises a material which is optically transparent.

10. The laser system of claim 1 wherein the lens is formed by the mass transport process.

11. The laser system of claim 1 wherein the laser has a tapered gain region.

12. A method for forming a laser system comprising the steps of:
mounting an edge-emitting semiconducting laser to a support body such that a side face of the support body is substantially parallel to the plane of an emitting face of the laser, the laser having an optical axis which projects through the emitting face;
forming a lens on a lens substrate, the lens having an optical axis which projects transversely through the substrate; and
mounting the lens substrate adjacent the emitting face of the laser and adjacent the side face of the support body such that the optical axis of the lens substantially aligns with the optical axis of the laser and such that a substantial portion of the lens substrate extends along substantially parallel to the plane of the support body, and further comprising the step of mounting the laser to the support body such that the emitting face of the laser projects beyond the side face of the support body.

13. The method of claim 12 further comprising the step of forming a raised region on one of the side surface of the support body and the lens substrate, and contacting the lens substrate and the support body at the raised surface.

14. The method of claim 12 further comprising the step of forming the support body from a heat sink material.

15. The method of claim 12 further comprising the step of forming the lens substrate from a material having an index of refraction which is substantially similar to the effective index of refraction of the semiconductor laser.

16. The method of claim 12 further comprising the step of positioning a spacer between the laser and the lens substrate for providing proper lens to laser separation for optically altering a beam of light emitted by the laser.

17. The method of claim 12 further comprising the step of forming the substrate of a depth substantially equal to the focal length of the lens such that the lens operates to collimate a beam emitted by the laser.

18. The method of claim 12 further comprising the step of forming the substrate to have a thickness greater than or less than the focal length of the lens such that the lens operates to focus a beam of light emitted by the laser.

19. The method of claim 12 further comprising the step of forming the lens substrate of a material of index of refraction greater than 1.

20. The method of claim 12 further comprising the step of forming the substrate of a material which is optically transparent.

21. The method of claim 12 wherein the step of forming a lens on a lens substrate further comprises forming the lens with the mass transport process.

22. The method of claim 12 further comprising the step of forming a tapered gain region in the laser.

* * * * *